United States Patent
Kidani et al.

(10) Patent No.: US 7,300,897 B2
(45) Date of Patent: *Nov. 27, 2007

(54) LOW TEMPERATURE SINTERING CERAMIC COMPOSITION FOR HIGH FREQUENCY, METHOD OF FABRICATING THE SAME AND ELECTRONIC COMPONENT

(75) Inventors: Naoki Kidani, Ishikawa (JP); Kiyoshi Mizushima, Ishikawa (JP); Mikio Takimoto, Ishikawa (JP)

(73) Assignee: Nikko Company, Ishikawa_Ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/548,380

(22) PCT Filed: Apr. 14, 2004

(86) PCT No.: PCT/JP2004/005296

§ 371 (c)(1),
(2), (4) Date: Sep. 8, 2005

(87) PCT Pub. No.: WO2004/092093

PCT Pub. Date: Oct. 28, 2004

(65) Prior Publication Data

US 2006/0172878 A1    Aug. 3, 2006

(30) Foreign Application Priority Data

Apr. 15, 2003    (JP)    ............... 2003-110244

(51) Int. Cl.
*C04B 35/20* (2006.01)
*C04B 35/22* (2006.01)
*B32B 18/00* (2006.01)

(52) U.S. Cl. ............ 501/108; 501/122; 428/701; 428/702

(58) Field of Classification Search ............... 501/108, 501/122, 123; 428/210, 701, 702
See application file for complete search history.

(56) References Cited

U.S. PATENT DOCUMENTS 6,232,251 B1    5/2001    Terashi

FOREIGN PATENT DOCUMENTS

| JP | 20000307661 | * | 2/2000 |
|----|-------------|---|--------|
| JP | 2001 240470 |   | 9/2001 |
| JP | 2001 278657 |   | 10/2001 |
| JP | 2002 173367 |   | 6/2002 |
| JP | 2003 63857 A |  | 3/2003 |
| JP | 2003 226572 |   | 8/2003 |
| JP | 2003238235  | * | 8/2003 |
| JP | 2004115295  | * | 4/2004 |

\* cited by examiner

*Primary Examiner*—Karl Group
(74) *Attorney, Agent, or Firm*—Stevens, Davis, Miller & Mosher, LLP

(57) ABSTRACT

A low temperature sintering ceramic composition can be sintered at 850 to 1,000° C., and the sintered ceramic has a low dielectric constant (9 or less at 16 Ghz or more) and a high Qf (10,000 or more). The composition can be co-sintered with wiring material containing Ag, Au, or Cu. The ceramic composition includes (by mass) CaO, MgO, and $SiO_2$ in total: over 60% to 98.6%; $Bi_2O_3$: from 1% to under 35%; and $Li_2O$: from 0.4% to under 6%; wherein (CaO+MgO) and $SiO_2$ are contained in the molar ratio of from 1:1 to under 1:2.5.

8 Claims, No Drawings

US 7,300,897 B2

LOW TEMPERATURE SINTERING CERAMIC COMPOSITION FOR HIGH FREQUENCY, METHOD OF FABRICATING THE SAME AND ELECTRONIC COMPONENT

This application is a 35 U.S.C. § 371 U.S. National Stage Application of International Application No. PCT/JP2004/005296, filed on Apr. 14, 2004, claiming the priority of Japanese Patent Application No. 2003-110244, filed Apr. 15, 2003, the entire disclosures of which are incorporated herein by reference in their entireties.

TECHNICAL FIELD

The present invention relates to a low temperature sintering ceramic (porcelain) composition having a low dielectric constant and a low dielectric loss for high frequency use, an electronic component using the same and relates to a fabricating method of the low temperature sintering ceramic.

BACKGROUND ART

In recent years, the arrival of a new era of information dissemination has required a high operation speed, high integration, and a high mounting density of a semiconductor device. In order to make a semiconductor device operate at a higher speed, it is indispensable to increase the signal propagation velocity on the circuit in addition to shortening the length of the wiring in the device. In this connection, the signal propagation velocity is inversely proportional to the square root of the relative dielectric constant of substrate material. For this reason, substrate material having a lower dielectric constant is becoming necessary. Furthermore, in order to attain the higher integration and the higher packaging density thereof, wiring material having low resistivity (Ag, Au, Cu, and the like) must be used. However, because these metals have a low melting point, it is necessary to use substrate material capable of sintering at a low temperature in the fabrication of a multi-layered printed wiring board that is obtained by sintering the substrate after the wiring pattern was printed thereon. For this reason, an alumina substrate (its dielectric constant: 9 to 9.5, and sintering temperature: approximately 1,500° C.) that has been so far widely used as substrate material for electronic component use are not applicable to high frequency printed circuit boards. Material that is other than this material, namely has a lower dielectric constant and can be sintered at a low temperature is required. In addition, the reduction of loss in a microwave zone and a millimeter-wave zone has been also required of the substrate material.

Therefore, recently, glass ceramic material composed of glass and inorganic filler has been studied for substrate material having a low dielectric constant, which can meet the increase of the operation speed. This type of glass ceramic material is suitable for insulating substrates for high frequency use because of having a low dielectric constant of 3 to 7, and can be advantageously co-sintered with Ag, Au, Cu, and the like each having a low conductor resistance, because the material can be sintered at a temperature of 800 to 1,000° C.

For example, JP-A-2000-188017 (U.S. Pat. No. 6,232, 251), discloses a ceramic composition for high frequency use that includes a glass phase capable of precipitating a diopside ($CaMgSi_2O_6$) type crystal phase and an oxide containing Mg and/or Zn and Ti as the filler, and that can be sintered at a temperature of 1,000° C. or less. Furthermore, JP-A-2001-240470 discloses a printed wiring board for high frequency use that is composed of a crystallized glass component containing $SiO^2$, $Al_2O_3$, MO (M denotes an alkaline earth metal element), and Pb, and at least one type of filler selected from a group of $Al_2O_3$, $SiO_2$, $MgTiO_3$, (Mg, Zn) $TiO_3$, $TiO_2$, $SrTiO_3$, $MgAl_2O_4$, $ZnAl_2O_4$, cordierite, mullite, enstatite, willemite, $CaAl_2Si_2O_8$, $SrAl_2Si_2O_8$, (Sr, Ca)$Al_2Si_2O_8$, and forsterite.

In addition, low temperature sintering ceramic compositions in which boron (B) is used as a sintering aide has been proposed (See JP-A-2002-037661, JP-A-2002-173367, etc.).

However, the above-described glass ceramic material, though having a low dielectric constant, has a high dielectric loss (tan δ) of approximately $2 \times 10^{-3}$ or more in a high frequency zone of a signal frequency of 10 GHz or more, that is, substantially in the range of $5 \times 10^3$ to $8 \times 10^3$ in terms of Qf value; accordingly, it does not have the characteristics enough to be put into practical use as the substrate material for high frequency use. For example, the ceramic composition of JP-A-2000-037661 has a Qf value of at most $0.5 \times 10^3$ and the composition of JP-A-2002-173367 has a Qf value on the order of $5 \times 10^3$. Here, the Qf value denotes a product of a measuring frequency (f/GHz) and Q ($\cong 1/\tan \delta$).

Moreover, JP-A-2001-278657 discloses a low temperature sintering ceramic composition that includes a diopside crystal ($CaMgSi_2O_6$) phase serving as the main crystal phase, characterized in that the dielectric constant ε of the composition is 7 or less, and the Qf value thereof is 10,000 GHz or more. However, the composition disclosed JP-A-2001-278657 essentially requires being subjected to calcining treatment at 1,100° C. or more, which increases the energy cost and the environmental load when manufacturing the substrate.

For this reason, an object of the present invention is to provide a low temperature sintering ceramic composition that can be co-sintered with a low resistance metal such as Ag, Au, Cu, and the like, reduce the energy cost and the environmental load required when manufacturing the ceramic therefrom, and moreover realize the low dielectric constant and the low dielectric loss in a high frequency region, and to provide a fabricating method of the low temperature sintering ceramic.

DISCLOSURE OF THE INVENTION

The present inventors, after studying hard to overcome the problems, found that a composition in which $Bi_2O_3$ and $Li_2O$ were added to oxides of Ca, Mg, and Si can be sintered at a temperature in the range of 850 to 1,000° C., and a low temperature sintering ceramic obtained by sintering such a composition has a low dielectric constant and a low dielectric loss without being calcined at a high temperature, and thereby accomplished the present invention.

The present invention provides the following low temperature sintering ceramic composition and fabricating method of a low temperature sintering ceramic.

(1) A low temperature sintering ceramic composition including the following chemical composition based on percent by mass: CaO, MgO, and $SiO_2$ in total: over 60% to 98.6%, wherein either of CaO and MgO may not be contained; $Bi_2O_3$: from 1% to under 35%; and $Li_2O$: from 0.4% to under 6%; wherein (CaO+MgO) and $SiO_2$ are contained in the molar ratio of from 1:1 to under 1:2.5.

(2) A low temperature sintering ceramic composition as described in (1), wherein CaO, MgO, and $SiO_2$ are contained at least in part as a complex oxide of Ca and/or Mg and Si.

(3) A low temperature sintering ceramic composition as described in (2), wherein the complex oxide containing Ca and/or Mg and Si includes a diopside ($CaO \cdot MgO \cdot 2SiO_2$) system crystal phase, an enstatite ($MgO \cdot SiO_2$) system crystal phase, and/or a wollastonite ($CaO \cdot SiO_2$) system crystal phase.

(4) A low temperature sintering ceramic composition as described in (1), (2), or (3) wherein the low temperature sintering ceramic composition has a dielectric constant of 9.0 or less and a Qf value of 10,000 or more, at 16 GHz or more.

(5) An electronic component comprising a wiring pattern on the low temperature sintering ceramic composition according to any one of above 1 to 4.

(6) The electronic component according to above 5, wherein the wiring is formed by sintering a conductive paste containing at lease one metal selected from Ag, Au and Cu.

(7) A fabricating method of a low temperature sintering ceramic composition including: mixing a raw material powder comprising the following chemical composition based on percent by mass: CaO, MgO, and $SiO_2$ in total: over 60% to 98.6%, wherein either of CaO and MgO may not be contained; $Bi_2O_3$: 1% to under 35%; and $Li_2O$: from 0.4% to under 6%, such that (CaO+MgO) and $SiO_2$ are contained in the molar ratio of from 1:1 to under 1:2.5; calcining the mixture below 850° C.; molding the material powder into a predetermined shape; and sintering the molded material powder at a temperature of 850° C. to 1,000° C.

(8) The method according to above 8, wherein the raw material powders are fine powders having a particle size of 2.0 μm or less.

DETAILED DESCRIPTION OF THE INVENTION (A) Ceramic Composition

A low temperature sintering ceramic composition according to the invention is a low temperature sintering ceramic composition including the following chemical composition based on percent by mass: CaO, Mgo, and $SiO_2$ in total: over 60% to 98.6%, wherein either of CaO and MgO may not be contained; $Bi_2O_3$: from 1% to under 35%; and $Li_2O$: from 0.4% to under 6%; wherein (CaO+MgO) and $SiO_2$ are contained in the molar ratio of from 1:1 to under 1:2.5, and preferably CaO, MgO, and $SiO_2$ are contained at least in part as a complex oxide of Ca and/or Mg and Si.

The low temperature sintering ceramic composition is a ceramic composition typically expressed by a composition formula:

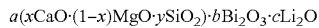

$a(xCaO \cdot (1-x)MgO \cdot ySiO_2) \cdot bBi_2O_3 \cdot cLi_2O$ (in the formula, a, b, and c represent the percentage by mass, and satisfy the following relationships:

$a+b+c=100$, $60 < a \leq 98.6$, $1 \leq b < 35$, $0.4 \leq c < 6$, x and y represent a molar ratio, $0 \leq x \leq 1$, x:y is from 1:1 to under 1:2.5.)

Incorporation of $Bi_2O_3$ and $Li_2O$ into the complex oxide that contains Ca, Mg, and Si can produce a $Bi_2O_3$—$SiO_2$ system liquid phase and a $Li_2O$—$SiO_2$ system liquid phase therein when the above mixture was heated, and the liquid phase reaction occurring at that time can perform the sintering thereof at a temperature in the range of 850 to 1,000° C.

The total amount of CaO, MgO, and $SiO_2$ in the low temperature sintering ceramic composition according to the present invention is from over 60% by mass to 98.6% by mass. When CaO, MgO, and $SiO_2$ are contained less than necessary, the characteristic of high Qf, obtained because the crystal phase containing these oxides assumes the primary phase therein, is deteriorated. When these oxides are contained more than necessary, the properties of low temperature sintering are lost. Though the preferred content depends on the amount of other components and the desired characteristics (for example, dielectric constant, Qf, strength, sintering temperature, or bulk density the, i.e., relative value obtained by dividing the observed density with the theoretical density calculated for a completely dense material on which prime importance is placed), the content thereof is usually from 75% by mass to 98% by mass, more preferably from 80% by mass to 96% by mass, and further preferably from 85% by mass to 95% by mass. The amount ratio of CaO and MgO can be arbitrarily determined, and either of the two oxides may not be contained. However, the molar ratio of (CaO+MgO) and $SiO_2$ is in the range of from 1:1 to under 1:2.5.

The total amount of $Bi_2O_3$ is from 1% by mass to under 35% by mass, and that of $Li_2O$ is from 0.4% by mass to under 6% by mass. That of $Bi_2O_3$ is preferably 1.5 to 25% by mass, and is more preferably 3 to 15% by mass. That of $Li_2O$ is preferably 0.4 to 5% by mass, and is more preferably in the range of 0.5 to 3% by mass.

When $Bi_2O_3$ is contained less than necessary, the low temperature sintering properties cannot be realized. When $Bi_2O_3$ is contained more than necessary, the bulk density becomes 4 g/cm³ or more, and further the dielectric constant becomes disadvantageously high because $2Bi_2O_3 \cdot 3SiO_2$ becomes a primary phase. When $Li_2O$ is contained less than necessary, the low temperature sintering properties cannot be realized. On the contrary, when $Li_2O$ is contained more than necessary, the dielectric loss in a high frequency region of 16 GHz becomes $1.0 \times 10^{-3}$ or more; accordingly, a high Qf value cannot be obtained.

A complex oxide of Ca, Mg, and Si may be any one as far as the molar ratio between CaO, MgO, and $SiO_2$ satisfies the above range; however, a complex oxide that satisfies $1 \leq n \leq 2$ when expressed by $(CaO, MgO) \cdot nSiO_2$ is preferably selected as a primary component. A complex oxide crystal at n=2 ($CaO \cdot MgO \cdot 2SiO_2$) is known as diopside, and complex oxide crystals at n=1 ($CaO \cdot SiO_2$) and ($MgO \cdot SiO_2$) are known as wollastonite and enstatite, respectively.

Accordingly, the low temperature sintering ceramic according to the invention, while preferably primarily containing a diopside system crystal phase, an enstatite system crystal phase, and/or a wollastonite system crystal phase, is further composed mainly of a $Bi_2O_3$—$SiO_2$ system crystal phase and a $Li_2O$—$SiO_2$ system crystal phase. Here, the "diopside system crystal phase" denotes diopside and crystal phases similar to this, and may contain the similar type of crystal phases composed of the components of the ceramic composition. The situations are similar also to a wollastonite system crystal phase, an enstatite system crystal phase, a $Bi_2O_3$—$SiO_2$ system crystal phase, and a $Li_2O$—$SiO_2$ system crystal phase.

The specific molar ratios of the respective phases, as far as the target values of the physical properties can be realized by the phases, are not restricted; however, ordinarily, the diopside system crystal phase, the enstatite system crystal phase, and/or the wollastonite system crystal phase are contained in an amount of 60% or more of a total volume of the ceramic, preferably in an amount of 80% or more, more preferably in an amount of 90% or more, and still more preferably in an amount of 95% or more.

Furthermore, as far as the effect of the invention is not lost, a $SiO_2$ system crystal phase or a similar system crystal phase and an amorphous material or a similar material may be contained.

The low temperature sintering ceramic according to the invention has a Qf value of 10,000 or more, and is densified to have a relative density of 95% or more by being sintered in the temperature range of 850° C. to 1,000° C.

(B) Method of Fabricating Low Temperature Sintering Ceramic

The low temperature sintering ceramic according to the invention can be fabricated by mixing a raw material powder including the following chemical composition based on percent by mass: a mixture and/or a complex oxide of CaO, MgO and $SiO_2$, in which (CaO+MgO) and $SiO_2$ are contained at a molar ratio of from 1:1 to 1:2.5 (wherein, either one of CaO and MgO may not be contained): from over 60.0% to 98.6%; $Bi_2O_3$: from 1% to under 35%, and $Li_2O$: from 0.4% to under 6%; calcining the mixture below 850° C., preferably 750° C. to 850° C.; suitably conducting pulverizing; and perfoming molding into a predetermined shape followed by being sintered at a temperature in the range of from 850° C. to 1,000° C.

CaO, MgO, and $SiO_2$ that are used as starting raw materials can be added not only in the form of oxide powder of the respective elements, but also in the form of complex oxide such as $Mg_2SiO_4$, carbonates, acetates, nitrates, and the like that can form an oxide in the course of the sintering.

To the above raw material of primary components, $Bi_2O_3$ powder and $Li_2O$ powder are added as the sintering additive such that the oxide powders are contained in the above concentration range, preferably in the preferable concentration range, followed by mixing. $Bi_2O_3$ and $Li_2O$ also can be also added not only in the form of oxide powder of the respective metals, but also in the form of carbonates, acetates, nitrates and the like that can form an oxide in the course of the sintering.

Raw material powders of CaO, MgO, $SiO_2$, $Bi_2O_3$, $Li_2O$ and the like, in order to increase the dispersion characteristics thereof and to obtain a desirable dielectric constant and a low dielectric loss, are preferably pulverized into fine powders of 2.0 μm or less, particularly 1.0 μm or less.

The powder mixture obtained by mixing the ingredients at the above ratio is mixed with an appropriately added binder. Then, the mixture is molded into an arbitrary shape by means of such as a mold pressing, extrusion molding, doctor blade, rolling method, and any other suitable method, and is sintered in an oxidizing atmosphere or a nonoxidizing atmosphere of $N_2$, Ar, and the like at a temperature of 850° C. to 1,000° C., particularly 850° C. to 950° C. for 1 to 3 hr, thereby enabling the mixture to be densified so as to have a relative density of 95% or more. When the sintering temperature at that time is lower than 850° C., the ceramic cannot be sufficiently densified. On the other hand, when it exceeds 1,000° C., though the densification can be attained, it becomes difficult to use low melting point conductors such as Ag, Au, Cu and the like as the wiring material.

According to the method according to the invention, a more active solid-liquid reaction proceeds between a solid phase containing complex oxides of Ca, Mg, and Si and a liquid phase containing a $Bi_2O_3$—$SiO_2$ system liquid phase and a $Li_2O$—$SiO_2$ system liquid phase; as a result, the ceramic can be densified with a slight amount of sintering aid. For this reason, an amount of an amorphous phase in grain boundary that causes an increase in the dielectric loss can be suppressed to the minimum amount. As mentioned above, according to the fabricating method according to the invention, in the ceramic, the diopside system crystal phase that contains at least Ca, Mg, and Si, the enstatite system crystal phase, and/or the wollastonite system crystal phase, the $Bi_2O_3$—$SiO_2$ system crystal phase, and the $Li_2O$—$SiO_2$ system crystal phase can be precipitated, and thereby, a ceramic for high frequency having a dielectric constant that can be controlled to 9 or less even at approximately 16 GHz, and having a low dielectric loss, in other words having a high Qf value can be obtained. Moreover, the adjustment of amount ratio of (CaO+MgO):$SiO_2$ enables the easy adjustment of the dielectric constant of the ceramic. For example, when the molar ratio of (CaO+MgO):$SiO_2$ is in the range of 1:1.75 to 1:2.5, it is possible to reduce the relative dielectric constant to seven or less, and when the molar ratio of (CaO+MgO):$SiO_2$ is in the range of 1:1 to 1:1.75, it is possible to adjust the relative dielectric constant within the range of 7 to 9.

(C) Applications of Ceramic Composition

The ceramic composition according to the invention can be sintered at a temperature of 850 to 1,000° C. Therefore, the ceramic can be used as the insulating substrate for a printed wiring board where wiring is carried out by using particularly Ag, Au, Cu, and the like. When a printed wiring board is fabricated by use of such ceramic composition, a powder mixture compounded as mentioned above is formed into a green sheet for use in the formation of insulating layer by means of a known tape formation method, for example, a doctor blade method and extrusion molding method. Thereafter, on the surface of the green sheet, by use of a conductive paste containing at least one type of metal, in particular, Ag powder, of Ag, Au and Cu, as a wiring circuit layer, a wiring pattern is printed in the form of a circuit pattern by means of a screen printing method, for example. Optionally, through holes and via holes may be formed through the sheet, followed by filling the holes with the above conductive paste. Thereafter, a plurality of green sheets are laminated under pressure, followed by sintering the sheets under the above conditions, and thereby the wiring layer and the insulating layer can be co-sintered.

Accordingly, the present invention also encompasses electronic components containing these circuits. The wiring pattern may also include a pattern comprising a material other than the materials mentioned above as long as it can be used under the sintering condition. Typical but not limiting examples thereof include a resistor formed of a material having a high-melting point. The electronic component may be composed of these wiring patterns or contain discrete devices mounted thereon.

BEST MODE FOR CARRYING OUT THE INVENTION

The present invention will be specifically described by way of examples and comparative examples. However, the present invention is not limited only to these examples.

EXAMPLES 1 TO 41

Compound mixtures composed of CaO, MgO ($Mg_2SiO_4$), $SiO_2$, $Bi_2O_3$, and $Li_2CO_3$ each having an average particle diameter of 1 μm or less were each mixed so as to obtain a content ratio in terms of oxide as shown in Tables 1 to 2. This mixture was calcined at 800° C. for 5 hours, suitably pulverized and added with an organic binder, a plasticizer, and toluene, followed by preparing green sheets each having a thickness of 150 μm by means of the doctor blade method. Then, five of the green sheets were stacked and subjected to thermocompression bonding under a pressure of 150 kg/cm2 at 70° C. The obtained laminate bodies, after heating the sheets in air at 500° C. so that the organic components may be decomposed and/or and evaporated, were sintered in air under the conditions shown in Table 1, thereby obtaining ceramics for multi-layered substrate.

The obtained sintered bodies were evaluated for the dielectric constant and the dielectric loss according to the following methods. The measurements were performed according to JIS R1627 "Testing method for dielectric properties of fine ceramics at microwave frequency." The ceramic for multi-layered substrate use was cut into a disc-like sample having a diameter of 1 to 5 mm and a thickness of 2 to 3 mm, and both end faces of the disc-like sample were short circuited by use of two parallel conductive plates to thereby form a dielectric resonator. The resonance characteristics and the no-load Q at TE011 mode of the dielectric resonator were measured in the range of 16 to 20 GHz by use of a network analyzer (Model 8722C manufactured by Hewlett-Packard Corp.) followed by calculating the dielectric constant and the dielectric loss (tanδ) further followed by calculating the Qf value from a measuring frequency and Q ($=1/tan\delta$). The complete results are shown in Tables 1 to 2.

Furthermore, each of the samples was subjected to X-ray diffractometry, and comparisons between the X-ray diffraction peaks of the samples and that of standard samples were made to identify the phases constituting the ceramics. The comparisons confirmed the existence in the ceramics, of each of the diopside crystal phase ($CaO \cdot MgO \cdot 2SiO_2$), wollastonite ($CaO \cdot SiO_2$) crystal phase, and/or enstatite crystal phase ($Mg \cdot SiO_4$), $Bi_2O_3$—$SiO_2$ system crystal phase (typically, eulytite ($2Bi_2O_3 \cdot 3SiO_4$), and $Li_2O$—$SiO_2$ system crystal phase.

As is apparent from the above results, all of the ceramics according to the invention that include CaO, MgO, $SiO_2$, $Bi_2O_3$ and $Li_2O$ within the scope of the invention, and that further have the diopside crystal phase, the wollastonite crystal phase and/or the enstatite system crystal phase, the $Bi_2O_3$—$SiO_2$ system crystal phase, and the $Li_2O$—$SiO_2$ system crystal phase, which are mainly precipitated therein as crystal phases, exhibit excellent values of a dielectric constant of 9 or less and a Qf value of 10,000 or more.

COMPARATIVE EXAMPLES 1 TO 6

Compound mixtures composed of CaO, MgO, $SiO_2$, $Bi_2O_3$, and $Li_2CO_3$ each having an average particle diameter of 1 μm or less were each mixed so as to obtain a content ratio in terms of oxide as shown in Table 2. As in the case of Examples 1 to 4, these compositions were sintered under the conditions shown in Tables 1 to 2, to thereby obtain ceramics for multi-layered substrate use. The results of the dielectric constants thereof measured as similarly in Examples are also shown in Tables 1 to 2.

A sample where $Bi_2O_3$ and $Li_2O$ were not added could not be sintered at a low temperature (Comparative Example 1), and a sample where $Bi_2O_3$ was added in an amount of less than 1% by mass (Comparative Example 2) and a samples where $Li_2O$ was added in an amount of less than 0.4% by mass (Comparative Example 4) were not sintered at a sintering temperature in range of the present invention. The bulk density tends to increase with an increase in the content of Bi, and the bulk density reached nearly 4.0 at a $Bi_2O_3$ content of 35% by mass (Comparative Example 5). Meanwhile, when the amount of $Li_2O$ reached 6% by mass (Comparative Example 3), the dielectric loss becomes large, and the Qf value decreased to less than 10,000. Moreover, in the sample where $(CaO+MgO):SiO_2$ exceeds 1:2.5 (Comparative Example 6), the Qf value thereof decreases to less than 10,000.

TABLE 1

| | | Composition ratio | Composition (molar ratio) | | | Composition (% by mass) | | | Additive (% by mass) | | Sintering temperature |
|---|---|---|---|---|---|---|---|---|---|---|---|
| | No. | | CaO | MgO | $SiO_2$ | CaO | MgO | $SiO_2$ | $Bi_2O_3$ | $Li_2O$ | (° C.) |
| Example | 1 | 93 | 1 | 1 | 2.5 | 21.1 | 15.2 | 56.7 | 5.0 | 2.0 | 883 |
| | 2 | 93 | 1 | 1 | 3 | 18.8 | 13.5 | 60.6 | 5.0 | 2.0 | 883 |
| | 3 | 93 | 1 | 1 | 3.5 | 17.0 | 12.2 | 63.8 | 5.0 | 2.0 | 883 |
| | 4 | 95 | 1 | 1 | 2.5 | 21.6 | 15.5 | 57.6 | 3.6 | 1.4 | 883 |
| | 5 | 91 | 1 | 1 | 2.5 | 20.7 | 14.9 | 55.4 | 6.4 | 2.6 | 883 |
| | 6 | 89 | 1 | 1 | 2.5 | 20.2 | 14.5 | 54.2 | 7.9 | 3.1 | 883 |
| | 7 | 90 | 1 | 1 | 2.5 | 20.5 | 14.7 | 54.8 | 8.0 | 2.0 | 883 |
| | 8 | 90 | 1 | 1 | 2.5 | 20.5 | 14.7 | 54.8 | 6.0 | 4.0 | 883 |
| | 9 | 95 | 1 | 1 | 2.5 | 21.6 | 15.5 | 57.9 | 4.5 | 0.5 | 950 |
| | 10 | 95 | 1 | 1 | 3 | 19.3 | 13.8 | 61.9 | 4.5 | 0.5 | 950 |
| | 11 | 95 | 1 | 1 | 3.5 | 17.4 | 12.5 | 65.1 | 4.5 | 0.5 | 950 |
| | 12 | 95 | 1 | 1 | 2.5 | 21.6 | 15.5 | 57.9 | 4.0 | 1.0 | 890 |
| | 13 | 95 | 1 | 1 | 3 | 19.3 | 13.8 | 61.9 | 4.0 | 1.0 | 890 |
| | 14 | 95 | 1 | 1 | 3.5 | 17.4 | 12.5 | 65.1 | 4.0 | 1.0 | 890 |
| | 15 | 95 | 1 | 1 | 2.5 | 21.6 | 15.5 | 57.9 | 4.5 | 0.5 | 955 |
| | 16 | 94.5 | 1 | 1 | 2.5 | 21.5 | 15.4 | 57.6 | 4.5 | 1.0 | 893 |
| | 17 | 93.5 | 1 | 1 | 2.5 | 21.3 | 15.3 | 57.0 | 4.5 | 2.0 | 893 |
| | 18 | 90.5 | 1 | 1 | 2.5 | 20.6 | 14.8 | 55.1 | 9.0 | 0.5 | 893 |
| | 19 | 86 | 1 | 1 | 2.5 | 19.6 | 14.1 | 52.4 | 13.5 | 0.5 | 893 |

TABLE 1-continued

| | No. | | Composition ratio | CaO | MgO | SiO$_2$ | CaO | MgO | SiO$_2$ | Bi$_2$O$_3$ | Li$_2$O | Sintering temperature (° C.) |
|---|---|---|---|---|---|---|---|---|---|---|---|---|
| | 20 | | 94.5 | 1 | 1 | 2.5 | 21.5 | 15.4 | 57.6 | 5.0 | 0.5 | 947 |
| | 21 | | 93.5 | 1 | 1 | 2.5 | 21.3 | 15.3 | 57.0 | 6.0 | 0.5 | 947 |
| | 22 | | 94 | 1 | 1 | 2.1 | 23.7 | 17.0 | 53.3 | 5.5 | 0.5 | 945 |
| | 23 | | 94 | 1 | 1 | 2.3 | 22.5 | 16.1 | 55.4 | 5.5 | 0.5 | 945 |
| | 24 | | 94 | 1 | 1 | 2.7 | 20.4 | 14.6 | 59.0 | 5.5 | 0.5 | 945 |

| | No. | | Holding time (hr) | Water absorption (%) | Bulk density (g/cm$^3$) | Frequency (GHz) | Dielectric constant | Q | Qf |
|---|---|---|---|---|---|---|---|---|---|
| Example | 1 | | 1 | 0.0 | 3.15 | 17.4 | 7.56 | 880 | 15312 |
| | 2 | | 1 | 0.0 | 3.13 | 17.6 | 7.21 | 799 | 14062 |
| | 3 | | 1 | 0.0 | 3.08 | 18.0 | 6.88 | 741 | 13345 |
| | 4 | | 1 | 0.0 | 3.19 | 17.4 | 7.59 | 1038 | 18054 |
| | 5 | | 1 | 0.0 | 3.22 | 17.4 | 7.60 | 773 | 13447 |
| | 6 | | 1 | 0.0 | 3.22 | 17.3 | 7.72 | 966 | 16719 |
| | 7 | | 1 | 0.0 | 3.26 | 17.4 | 7.72 | 880 | 15310 |
| | 8 | | 1 | 0.0 | 3.22 | 17.2 | 7.77 | 735 | 12633 |
| | 9 | | 1 | 0.0 | 3.17 | 17.4 | 7.45 | 1063 | 18493 |
| | 10 | | 1 | 0.0 | 3.09 | 18.4 | 6.99 | 1025 | 18856 |
| | 11 | | 1 | 0.0 | 3.04 | 18.5 | 6.77 | 809 | 14972 |
| | 12 | | 1 | 0.0 | 3.11 | 18.0 | 7.30 | 868 | 15615 |
| | 13 | | 1 | 0.0 | 3.09 | 18.1 | 6.98 | 1051 | 19018 |
| | 14 | | 1 | 0.0 | 3.00 | 19.2 | 6.54 | 939 | 18029 |
| | 15 | | 1 | 0.0 | 3.13 | 17.7 | 7.41 | 1177 | 20789 |
| | 16 | | 1 | 0.0 | 3.17 | 17.3 | 7.48 | 1518 | 26312 |
| | 17 | | 1 | 0.0 | 3.19 | 17.3 | 7.56 | 916 | 15851 |
| | 18 | | 1 | 0.0 | 3.26 | 17.4 | 7.56 | 1851 | 32138 |
| | 19 | | 1 | 0.0 | 3.44 | 17.4 | 7.84 | 1812 | 31472 |
| | 20 | | 1 | 0.0 | 3.16 | 18.0 | 7.31 | 959 | 17272 |
| | 21 | | 1 | 0.0 | 3.20 | 17.9 | 7.44 | 872 | 15599 |
| | 22 | | 1 | 0.0 | 3.26 | 17.2 | 7.79 | 1247 | 21395 |
| | 23 | | 1 | 0.0 | 3.20 | 17.4 | 7.60 | 1087 | 18958 |
| | 24 | | 1 | 0.0 | 3.17 | 17.7 | 7.28 | 1109 | 19639 |

TABLE 2

| | No. | Composition ratio | Composition (molar ratio) | | | Composition (% by mass) | | | Additive (% by mass) | | Sintering temperature (° C.) |
|---|---|---|---|---|---|---|---|---|---|---|---|
| | | | CaO | MgO | SiO$_2$ | CaO | MgO | SiO$_2$ | Bi$_2$O$_3$ | Li$_2$O | |
| Example | 25 | 96 | 1 | 1 | 2.5 | 21.8 | 15.7 | 58.5 | 3.0 | 1.0 | 959 |
| | 26 | 98 | 1 | 1 | 2.5 | 22.3 | 16.0 | 59.7 | 1.0 | 1.0 | 959 |
| | 27 | 90.5 | 1 | 1 | 2.5 | 20.6 | 14.8 | 55.1 | 4.5 | 5.0 | 900 |
| | 28 | 93.5 | 1 | 1 | 2.1 | 23.6 | 16.9 | 53.0 | 5.5 | 1.0 | 900 |
| | 29 | 92.5 | 1 | 1 | 2.1 | 23.3 | 16.7 | 52.4 | 5.5 | 2.0 | 949 |
| | 30 | 93.5 | 1 | 1 | 2 | 24.2 | 17.4 | 51.9 | 5.5 | 1.0 | 963 |
| | 31 | 93.5 | 1 | 1 | 2.2 | 22.9 | 16.5 | 54.1 | 5.5 | 1.0 | 908 |
| | 32 | 93.5 | 1 | 1 | 2.3 | 22.4 | 16.1 | 55.1 | 5.5 | 1.0 | 908 |
| | 33 | 95 | 1 | 1 | 4 | 15.8 | 11.4 | 67.8 | 4.5 | 0.5 | 943 |
| | 34 | 94.5 | 0.2 | 1.8 | 2.2 | 4.9 | 31.7 | 57.9 | 4.5 | 1.0 | 908 |
| | 35 | 94.5 | 0.5 | 1.5 | 2.2 | 12.0 | 25.9 | 56.6 | 4.5 | 1.0 | 908 |
| | 36 | 94.5 | 0.8 | 1.2 | 2.2 | 18.8 | 20.3 | 55.4 | 4.5 | 1.0 | 908 |
| | 37 | 94.5 | 1.3 | 0.7 | 2.2 | 29.5 | 11.4 | 53.5 | 4.5 | 1.0 | 882 |
| | 38 | 94.5 | 1.6 | 0.4 | 2.2 | 35.6 | 6.4 | 52.5 | 4.5 | 1.0 | 882 |
| | 39 | 94.5 | 0 | 2 | 2.2 | 0.0 | 35.8 | 58.7 | 4.5 | 1.0 | 903 |
| | 40 | 94.5 | 1.8 | 0.2 | 2.2 | 39.6 | 3.2 | 51.8 | 4.5 | 1.0 | 939 |
| | 41 | 94.5 | 2 | 0 | 2.2 | 43.4 | 0.0 | 51.1 | 4.5 | 1.0 | 861 |
| Comparative Example | 1 | 100 | 1 | 1 | 2 | 21.5 | 15.5 | 46.1 | 0.0 | 0.0 | 1280 |
| | 2 | 98.5 | 1 | 1 | 2 | 25.5 | 18.3 | 54.7 | 0.5 | 1.0 | 963 |
| | 3 | 89.5 | 1 | 1 | 2.5 | 20.4 | 14.6 | 54.5 | 4.5 | 6.0 | 949 |
| | 4 | 95.2 | 1 | 1 | 2.5 | 21.7 | 15.6 | 58.0 | 4.5 | 0.3 | 957 |
| | 5 | 64.5 | 1 | 1 | 2.5 | 14.7 | 10.5 | 39.3 | 35.0 | 0.5 | 895 |
| | 6 | 95 | 1 | 1 | 5 | 13.4 | 9.6 | 71.9 | 4.5 | 0.5 | 943 |

| | No. | | Holding time (hr) | Water absorption (%) | Bulk density (g/cm$^3$) | Frequency (GHz) | Dielectric constant | Q | Qf |
|---|---|---|---|---|---|---|---|---|---|
| Example | 25 | | 1 | 0.0 | 3.14 | 17.9 | 7.33 | 1115 | 19920 |
| | 26 | | 1 | 0.0 | 3.09 | 17.9 | 7.18 | 1421 | 25452 |
| | 27 | | 1 | 0.0 | 3.13 | 17.2 | 7.68 | 822 | 14176 |
| | 28 | | 1 | 0.0 | 3.27 | 17.3 | 7.90 | 2077 | 36019 |
| | 29 | | 1 | 0.0 | 3.25 | 17.2 | 7.96 | 875 | 15088 |
| | 30 | | 1 | 0.0 | 3.28 | 17.8 | 8.20 | 792 | 14127 |

TABLE 2-continued

|  |  |  |  |  |  |  |  |  |
|---|---|---|---|---|---|---|---|---|
|  | 31 | 1 | 0.0 | 3.23 | 18.2 | 7.81 | 1804 | 32865 |
|  | 32 | 1 | 0.0 | 3.25 | 18.4 | 7.67 | 1581 | 29066 |
|  | 33 | 1 | 0.0 | 2.97 | 18.7 | 6.47 | 666 | 12434 |
|  | 34 | 1 | 0.0 | 3.17 | 18.9 | 7.12 | 1738 | 32877 |
|  | 35 | 1 | 0.0 | 3.20 | 18.6 | 7.40 | 1551 | 28794 |
|  | 36 | 1 | 0.0 | 3.26 | 18.2 | 7.72 | 1569 | 28542 |
|  | 37 | 1 | 0.0 | 3.14 | 17.0 | 7.63 | 1188 | 20212 |
|  | 38 | 1 | 0.0 | 3.05 | 17.3 | 7.21 | 1869 | 32410 |
|  | 39 | 1 | 0.0 | 3.16 | 18.0 | 6.95 | 1685 | 30396 |
|  | 40 | 1 | 0.0 | 2.97 | 18.0 | 7.02 | 1025 | 18421 |
|  | 41 | 1 | 0.0 | 2.90 | 18.5 | 6.81 | 1233 | 22782 |
| Comparative Example | 1 | 3 | 0.0 | 3.23 | 17.8 | 7.64 | 3684 | 65579 |
|  | 2 | 1 | Not sintered |  |  |  |  |  |
|  | 3 | 1 | 0.0 | 3.09 | 17.4 | 7.67 | 522 | 9053 |
|  | 4 | 1 | Not sintered |  |  |  |  |  |
|  | 5 | 1 | 0.0 | 3.98 | 16.2 | 9.15 | 1334 | 21571 |
|  | 6 | 1 | 0.0 | 2.96 | 19.1 | 6.24 | 377 | 7191 |

COMPARATIVE EXAMPLE 7

A composition that was prepared in the same conditions as in Example 28 except that B is used in place of Bi, was sintered at almost the same temperature (921° C.). This composition corresponds to the one disclosed in JP-A-2001-278657, except that $B_2O_3$ was added when the calcination was performed at 800° C. in this comparative example while in JP-A-2001-278657, only the principal ingredients (CaO, MgO, and $SiO_2$) were calcined at 1100° C., added with $B_2O_3$ and then sintered. As a result, the Q value was 523 at 16.7 GHz, and the Qf value (8749) was less than 10,000. The specific composition and results thereof are shown in Table 3 (The composition and results of Example 28 are the same as the ones shown in Table 2).

As mentioned above, the composition is calcined at 1,100° C. or more, before addition of the additive component ($B_2O_3$ and the like) in order to produce a diopside crystal phase in the Examples disclosed in JP-A-2001-278657. However, as is apparent from the results of Comparative Example 7, the Qf value decreases greatly when the diopside-crystal-constituting components (the oxides of Ca, Mg, and Si) are added with $B_2O_3$ without preliminarily having been subjected to calcination, and all the ingredients are calcined as a whole, and then (after pulverized and molded) sintered. In contrast to this, according to the present invention in which $Bi_2O_3$ is used as an additive component, even though the composition is calcined as a whole, and then (after pulverized and molded) sintered, a ceramic having a high Qf value is obtained.

INDUSTRIAL APPLICABILITY

As detailed above, the low temperature sintering ceramic composition according to the invention, as a result of the use of oxides of Bi and Li as a liquid phase formation component, realized the low temperature sintering properties in the ceramic composition that includes as the main phase the diopside system crystal phase, the enstatite system crystal phase and/or the wollastonite system crystal phase. Furthermore, it was found that even when $Bi_2O_3$ was incorporated in a large amount, the dielectric loss is not deteriorated. Thereby, a high Qf value can be realized. Accordingly, the ceramic composition according to the invention, is most suitable as a low loss LTCC (low temperature co-firing ceramics) material having the dielectric constant (9 or less) that can be utilized in a high frequency region of 16 GHz or more and having a high Qf (10,000 or more), and thereby can be used in various types of microwave circuit elements and the like. Further, because the ceramic can be fabricated from the ceramic composition, merely by sintering all of the components at 850° C. to 1,000° C., the wiring composed of Cu, Au, Ag, and the like can be formed by means of co-firing, and the energy cost and environmental load that are required for manufacturing the ceramic are small.

The invention claimed is:

1. A low temperature sintering ceramic composition comprising the following chemical composition based on percent by mass:

CaO, MgO, and $SiO_2$ in total: over 60% to 98.6%, wherein either of CaO and MgO may not be contained;

TABLE 3

| No. | | Composition ratio | Composition (molor ratio) | | | Composition (% by mass) | | | Additive (% by mass) | | Sintering temperature (° C.) |
|---|---|---|---|---|---|---|---|---|---|---|---|
|  |  |  | CaO | MgO | $SiO_2$ | CaO | MgO | $SiO_2$ | $Bi_2O_3$ | $Li_2O$ |  |
| Ex. | 28 | 93.5 | 1 | 1 | 2.1 | 23.6 | 16.9 | 53.0 | 5.5 | 1.0 | 900 |
| Com. Ex. | 7 | 93.5 | 1 | 1 | 2.1 | 23.6 | 16.9 | 53.0 | 5.5 | 1.0 | 921 |

| No. | | Holding time (hr) | Water absorption (%) | Bulk density (g/cm$^3$) | Frequency (GHz) | Dielectric constant | Q | Qf |
|---|---|---|---|---|---|---|---|---|
| Ex. | 28 | 1 | 0.0 | 3.27 | 17.3 | 7.90 | 2077 | 36019 |
| Com. Ex. | 7 | 1 | 0.0 | 3.07 | 16.7 | 7.55 | 523 | 8749 |

$Bi_2O_3$: from 1% to under 35%; and $Li_2O$: from 0.4% to under 6%;

wherein (CaO+MgO) and $SiO_2$ are contained in the molar ratio of from 1:1 to under 1:2.5.

2. A low temperature sintering ceramic composition according to claim 1, wherein CaO, MgO, and $SiO_2$ are contained at least in part as a complex oxide of Ca and/or Mg and Si.

3. A low temperature sintering ceramic composition according to claim 2, wherein the complex oxide containing Ca and/or Mg and Si comprises a diopside ($CaO.MgO.2SiO_2$) system crystal phase, an enstatite ($MgO.SiO_2$) system crystal phase, and/or a wollastonite ($CaO.SiO_2$) system crystal phase.

4. A low temperature sintering ceramic composition according to claim 1, wherein the low temperature sintering ceramic composition has a dielectric constant of 9.0 or less and a Qf value of 10,000 or more, at 16 GHz or more.

5. An electronic component comprising a wiring pattern on the low temperature sintering ceramic composition according to claim 1.

6. The electronic component according to claim 5, wherein the wiring is formed by sintering a conductive paste containing at least one metal selected from the group consisting of Ag, Au and Cu.

7. A fabricating method of a low temperature sintering ceramic composition comprising:

mixing a raw material powder comprising the following chemical composition based on percent by mass: CaO, MgO, and $SiO_2$ in total: over 60% to 98.6%, wherein either of CaO and MgO may not be contained; $Bi_2O_3$: 1% to under 35%; and $Li_2O$: from 0.4% to under 6%, such that (CaO+MgO) and $SiO_2$ are contained in the molar ratio of from 1:1 to under 1:2.5;

calcining the mixture below 850° C.;

molding the material powder into a predetermined shape; and sintering the molded material powder at a temperature of 850° C. to 1,000° C.

8. The method according to claim 7, wherein the raw material powders are fine powders having a particle size of 2.0 μm or less.

* * * * *